US008941068B2

(12) United States Patent
Fendler et al.

(10) Patent No.: US 8,941,068 B2
(45) Date of Patent: Jan. 27, 2015

(54) INFRARED IMAGERY DEVICE WITH INTEGRATED SHIELD AGAINST PARASITE INFRARED RADIATION AND METHOD OF MANUFACTURING THE DEVICE

(75) Inventors: Manuel Fendler, Grenoble (FR); Guillaume Druart, Palaiseau (FR)

(73) Assignees: Commissariat àl'Énergie Atomique et aux Énergies Alternatives, Paris (FR); Office National d'Etudes et de Recherches Aérospatiales, Chatillon (FR)

( * ) Notice: Subject to any disclaimer, the term of this patent is extended or adjusted under 35 U.S.C. 154(b) by 369 days.

(21) Appl. No.: 13/487,578

(22) Filed: Jun. 4, 2012

(65) Prior Publication Data

US 2012/0312993 A1 Dec. 13, 2012

(30) Foreign Application Priority Data

Jun. 9, 2011 (FR) ...................................... 11 01767

(51) Int. Cl.
*G01J 5/02* (2006.01)
*H04N 5/33* (2006.01)

(52) U.S. Cl.
CPC ...................................... *H04N 5/33* (2013.01)
USPC ......................................... 250/353; 250/352

(58) Field of Classification Search
CPC ... G01J 1/0411; G01J 5/0806; G01N 21/3581
USPC ................................................. 250/353, 352
See application file for complete search history.

(56) References Cited

U.S. PATENT DOCUMENTS

| 5,701,008 | A | * | 12/1997 | Ray et al. ...................... 250/352 |
| 7,786,561 | B2 | * | 8/2010 | Pornin et al. .................. 257/682 |
| 7,851,903 | B2 | * | 12/2010 | Ichikawa ...................... 257/704 |
| 8,525,323 | B2 | * | 9/2013 | Yamazaki et al. ............ 257/704 |
| 2005/0078208 | A1 | | 4/2005 | Minarik et al. |

(Continued)

FOREIGN PATENT DOCUMENTS

WO WO 2006/122907 A1 11/2006
WO WO 2010/040914 A2 4/2010

OTHER PUBLICATIONS

Preliminary Search Report issued Jan. 18, 2012 in France Patent Application No. FR 1101767 FA 756054 (with English translation of Category of Cited Documents).

(Continued)

*Primary Examiner* — Christine Sung
(74) *Attorney, Agent, or Firm* — Oblon, Spivak, McClelland, Maier & Neustadt, L.L.P.

(57) ABSTRACT

Infrared imagery device with integrated shield against parasite infrared radiation, and method of manufacturing the device. This device comprises a support provided with an infrared radiation detector, at least one optical device facing the detector, and a shield against parasite radiation. The shield comprises at least two continuous beads, spaced from each other, extending from the support as far as the optical device, provided with vents and made of a material that significantly attenuates parasite radiation, penetrating laterally between the support and the optical device. The two beads with their vents 15 form a baffle. The device is manufactured using the flip chip technique.

14 Claims, 9 Drawing Sheets

(56) References Cited

U.S. PATENT DOCUMENTS

| | | | |
|---|---|---|---|
| 2006/0082681 A1* | 4/2006 | Minarik et al. | 348/373 |
| 2006/0226366 A1 | 10/2006 | Tanaka et al. | |
| 2007/0170363 A1* | 7/2007 | Schimert et al. | 250/353 |
| 2012/0013706 A1 | 1/2012 | Druart et al. | |
| 2013/0153769 A1* | 6/2013 | Singer | 250/338.1 |
| 2013/0340991 A1 | 12/2013 | Lasfargues et al. | |

OTHER PUBLICATIONS

Book by G. Humpston and D. Jacobson, Principles of soldering, ASM International, 2004, pp. 189-242.

Jun Tanida et al., "Thin observation module by bound optics (TOMBO): concept and experimental verification", Applied Optics, vol. 40, No. 11, Apr. 10, 2001, pp. 1806-1813.

* cited by examiner

INFRARED IMAGERY DEVICE WITH INTEGRATED SHIELD AGAINST PARASITE INFRARED RADIATION AND METHOD OF MANUFACTURING THE DEVICE

TECHNICAL FIELD

This invention relates to an infrared imagery device with integrated shield against parasite infrared radiation, and a method of manufacturing this device.

It is particularly applicable to the domain of cryogenic cameras; the infrared detector of a camera of this type is cooled to reduce the thermal noise of the images that it outputs; therefore it must be protected from parasite infrared radiation emitted by warm parts of the cryostat inside which the camera is placed.

STATE OF PRIOR ART

Figure 1:
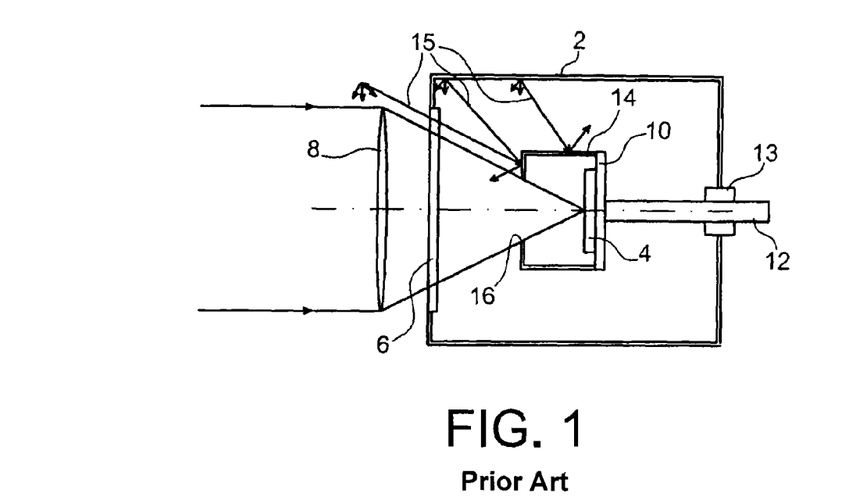
FIG. 1 is a diagrammatic sectional view of a known cryostat containing a known cryogenic camera, and has already been described.

FIG. 1 shows a diagrammatic sectional view of a known cryostat 2 containing a known cooled thermal camera, namely a cryogenic camera. The inside of the cryostat is put under a vacuum; the residual pressure is typically equal to $10^{-5}$ Pa or less. The vacuum is made either once and for all which is the case in the example shown in FIG. 1, or dynamically, using appropriate means not shown.

The cryogenic camera comprises:
an infrared detection device 4 placed in the cryostat 2, facing a window 6 fitted in the cryostat, and
an optical device 8 that will form the image of a scene observed on the infrared detection device 4 and which faces the window 6, outside the cryostat 2.

A cold table 10 is placed inside the cryostat and the infrared detection device 4 is placed on this table. As can be seen, this cold table is extended by a cold pin 12 that passes through a wall of the cryostat through an appropriate hermetically sealed passage 13.

This cold pin 12 forms the end of a cryogenic machine (not shown) placed outside the cryostat. This machine may for example be a rotating cryogenic machine or a Stirling cooler or a pulse tube.

Therefore the infrared detection device 4 is cooled in the cryogenic range, typically to a temperature of 77 K. This minimises thermal noise in order to obtain the best possible signal to noise ratio.

The infrared detection device 4 is provided with a shield 14 to protect it from parasite infrared radiation. This shield is usually made of aluminium that is a light metal and a good conductor of heat. There is an aperture 16 in it forming a diaphragm to define the view angle of the infrared detection device 4, for example 30°.

This shield 14 is designed to stop or attenuate the transmission of thermal radiation 15 originating from zones outside the field of the camera such as
points located outside the scene aimed at through the aperture in the optical device 8, and
the warm walls of the cryostat that are at ambient temperature (about 20° C.).

The shield 14 is fixed to the cold table 10. Therefore it is cooled—this is why it is also called the cold shield—to prevent any internal radiative pollution.

In fact the volume occupied by the camera is essentially dependent on the optical device (located outside the cryostat 2). For example, refer to the following document:
WO 2006/122907, Optical head for detecting the launch of missiles or other monitoring equipment, Bouchardy et al.

It shows a very wide field camera comprising a large volume optical device.

However, there is an increasing need to miniaturise optronic systems to be able to integrate them into means for example such as light aircraft, in which only small volume objects can be fitted.

Thus, the integration of optical functions as close as possible to a detection device is a means of designing miniaturised complete systems with a mass of the order of 1 kg or less and a size of the order of 10 cm or less, while providing better optical and radiometric performances than conventional systems.

For a long time, it was impossible to integrate additional functions into an optronic system to satisfy genuine operational needs. But the integration of optical functions into the free space defined by the volume of the cold shield has been envisaged recently. For example, refer to the following document:
US 2005/0078208, Cold shield for cryogenic camera, Minarik et al.

Remember also that a flip chip technique is known. This technique is used to assemble and interconnect chips to each other; and as a result the final height of the assembly is obtained with excellent precision, of the order of 1 µm.

Therefore, this technique is directly useful in optoelectronics for relative positioning of optical devices, and in particular can result in optical coupling between two optical devices in free space.

This technique may be applied to matrix detection devices. For example, it can be used to fabricate the detection device seen in the diagrammatic sectional view in FIG. 2.

Figure 2:
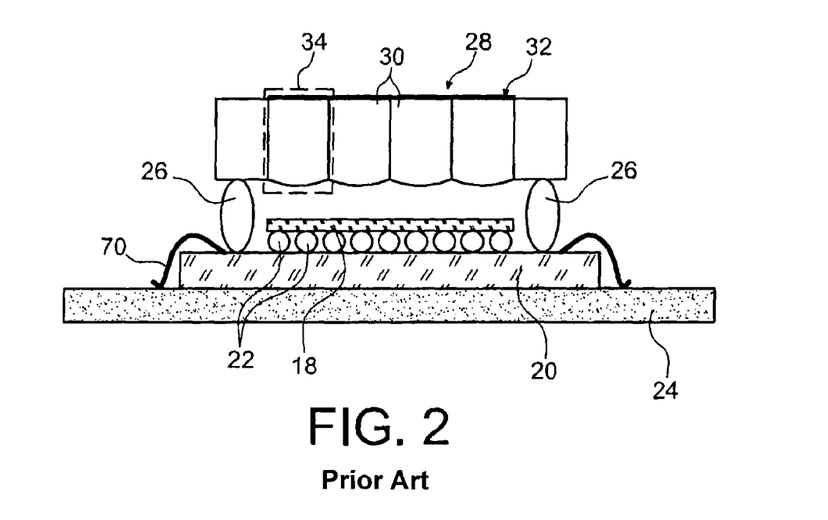
FIG. 2 is a diagrammatic sectional view of an infrared camera on chip and has already been described.

This is an infrared camera-on-chip device and it comprises a first assembly of an infrared detection circuit 18, or infrared retina, on a read circuit 20. This assembly is made using the flip chip technique and using solder balls 22. The read circuit is fixed to a ceramic substrate 24 that forms a mechanical support and also serves as an optical reference: all optics are positioned relative to this mechanical support.

With larger solder balls 26, an optical device 28 may be hybridised to the read circuit 20. This optical device 28 will form the image of a scene on the infrared detection device 18. For example, the optical device 28 comprises a micro-lenses matrix 30, for which the distance to the infrared detection circuit 18 is defined by the height of the large solder balls 26.

As can be seen in FIG. 2, the microlens matrix placed above the infrared detection circuit 18 forms a diaphragmed cold filter, because of a metal hole mask 32 fitted in it.

Such an architecture is the result of periodic repetition of a diaphragmed single channel optical element 34. Concerning such an element reference is made to the following document:
WO 2010/040914, Infrared wide field imaging system integrated in a vacuum housing, Druart et al.

The optical device 28 enables miniaturisation of the camera by bringing this device towards the retina 18 according to a TOMBO type concept, known in the following document to which reference should be made:
Jun Tanida et al., Thin observation module by bound optics (TOMBO): concept and experimental verification, Applied Optics, Vol. 40, No. 11, 2001, pp. 1806-1813.

PRESENTATION OF THE INVENTION

This invention is aimed at solving the problem of a shield for an infrared imagery device against parasite infrared radiation. This radiation may comprise radiation arriving on the infrared radiation detector forming part of the device and not originating from the observation field like frontal parasite radiation.

More specifically, this invention is aimed at solving the problem of a shield for such an imagery device against parasite infrared radiation that could penetrate laterally into the space between the infrared radiation detector and the optical device that forms part of the infrared imagery device.

Specifically, this invention discloses an infrared imagery device comprising:
  a support, comprising an infrared radiation detector that comprises a zone sensitive to infrared radiation,
  at least one optical device placed facing the infrared radiation detector, and
  a shield device against parasite infrared radiation, namely frontal parasite radiation capable of penetrating into a space between the support and the optical device, through this optical device, and lateral parasite radiation that can penetrate laterally into this space,
characterised in that the shield device comprises at least a shield assembly comprising N continuous beads spaced from each other, each provided with a vent and made of a material that can significantly attenuate lateral parasite radiation, and each of the N beads extends from the support as far as the optical device, in which N is an integer number equal to at least 2, in which the rank 1 bead surrounds at least the sensitive zone of the infrared radiation detector, the rank i bead surrounds the rank i−1 bead, where i varies from 2 to N, and the N beads provided with their corresponding vents form at least one baffle.

Note that attenuation of the lateral parasite radiation is more than 80% and the material from which the beads are made is chosen to be sufficiently diffusing so that the number of beads to be used is not too high.

Note also that:
  the vents are used to evacuate air located between the optical device and the infrared radiation detector when the infrared imagery device is put under a vacuum, and
  the space between two consecutive beads forms a guide zone for any parasite radiation that might have penetrated into this space; this radiation is then guided between the walls of the beads and its intensity reduces as it progresses between the walls.

The invention has a number of advantages:
  it avoids the need to use glue to glue the support of the infrared radiation detector to the support of the optical device; and
  it eliminates the problem of reliability of uniform gluing between the detector support and the component support; this is because this invention makes no attempt to obtain a hermetic seal, particularly because a vacuum will be created in the zone in which the infrared radiation detector is located.

According to one preferred embodiment of the infrared imagery device according to the invention, in each shield assembly, the vents for rank $i$ and i+1 beads respectively, where i varies from 1 to N−1, are at 180° from each other.

Preferably, the size of each vent is within the interval [1 μm; 10 μm].

According to one particular embodiment of the device according to the invention, the number N is equal to at least 3.

Preferably, the spacing between consecutive beads in each shield assembly is within the interval [1 μm; 10 μm].

In this invention, the beads are advantageously solder beads.

According to a first preferred embodiment of the invention, the optical device comprises first and second opposite faces, the second face is facing the infrared radiation detector and the shield device also comprises a layer formed on the first face, made of a material capable of attenuating frontal parasite radiation, and comprises apertures.

Preferably, said optical device comprises a material on its sides capable of preventing transmission of lateral parasite radiation.

According to a second preferred embodiment of the invention, the infrared imagery device comprises M optical devices, the shield device comprises M shield assemblies, where M is an integer number equal to at least 2, each optical device comprises first and second opposite faces, the second face of the rank 1 optical device faces the infrared radiation detector, the second face of the rank $j$ optical device is facing the first face of the rank j−1 optical device, the rank 1 shield assembly extends from the support as far as the rank 1 optical device and the rank $j$ shield assembly extends from the rank j−1 optical device to the rank $j$ optical device, where $j$ varies from 2 to M, the shield device also comprises a layer formed on the front face of the rank M optical device, and this layer is made of a material capable of attenuating frontal parasite radiation and comprises apertures.

According to one particular embodiment of the invention, the support also comprises a substrate and a read circuit on the substrate, the infrared radiation detector is hybridised to the read circuit by solder balls and the optical device closest to the substrate is connected to one of the elements chosen from among the infrared radiation detector, the read circuit and the substrate through a shield assembly.

According to another particular embodiment, the support also comprises an interconnection network between the substrate and the read circuit, and the optical device closest to the substrate is connected to one of the elements chosen among the infrared radiation detector, the read circuit, the substrate and the interconnection network through a shield assembly.

According to another particular embodiment, at least one optical device comprises a microlens matrix defining elementary detection channels, and the imagery device also comprises a set of walls made of a material capable of significantly attenuating parasite radiation, placed between the microlens matrix and the detector and that will separate the elementary channels from each other.

This invention also relates to a method of manufacturing the infrared imagery device according to this invention, in which:
  the shield assembly is made on the support comprising the infrared radiation detector,
  the optical device is placed facing the infrared radiation detector, and
  the optical device is fixed to the shield assembly.

According to one preferred embodiment of the manufacturing method:
  the infrared radiation detector is assembled to the support using the flip chip technique,
  solder beads are used to form the shield assembly, and
  the optical device is fixed to the solder beads using the flip chip technique.

BRIEF DESCRIPTION OF THE DRAWINGS

This invention will be better understood after reading the description of example embodiments given below purely for guidance purposes and in no way limitative with reference to the appended drawings in which.

DETAILED DESCRIPTION OF PARTICULAR EMBODIMENTS

The following describes various examples of the invention. These examples use the camera on chip that was described with reference to FIG. 2.

According to the invention, this camera is modified in order to shield it against parasite infrared radiation originating from:
- the cryogenic containment or cryostat (not shown) inside which the camera is placed when it is being used, and
- what is outside the observation field in the scene facing which the camera is placed.

Frontal parasite infrared radiation is defined as being parasite infrared radiation that can penetrate into the space between the add-on optical device 28 (FIG. 2) and the infrared detection circuit 18 passing through this optical device 28.

Lateral parasite infrared radiation is also defined as being parasite infrared radiation that can penetrate laterally into that space between the large solder balls 26 that were used to hybridise the optical device 28 to the read circuit 20.

The configuration of the camera on chip gives an intrinsic protection property: the add-on optical device 28 makes it possible to shield the camera against frontal parasite infrared radiation due to the diaphragmed face of this optical device 28, namely the face on which the hole mask 32 is located. Thus, all that remains to be done is to protect the camera on chip from lateral parasite infrared radiation.

According to the invention, instead of using large solder balls 26, a peripheral solder bead forming a continuous joint is used to form the lateral optical shield.

For transferring the microlens matrix forming the optical device 28 a continuous solder bead is thus formed with a height after solidification defined by:
- the solder volume used before the solder reflow, and
- wettable surfaces facing each other.

In this case, conventional hybridisation rules that use the equilibrium of surface tensions of molten solder are used. Refer to the following document for further information on this subject:

G. Humpston and D. Jacobson, Principles of soldering, pp. 189-242, ASM International, 2004.

In fact, a vent must be provided in the bead to evacuate air between the optical device and the detection circuit, when creating a vacuum in the cryostat.

Furthermore, two solder beads each with its own vent are provided instead of one to make a good optical shield minimising the introduction of parasite radiation. And vents are arranged such that the beads with these vents form at least one baffle inside which residual parasite radiation will be trapped. For example, if only two beads are provided, the corresponding vents will not face each other.

However, for very sensitive components for which a very low signal to noise ratio is necessary, it may be decided to use more than two beads and to increase the number of baffles by arranging the beads appropriately.

Figure 3A:
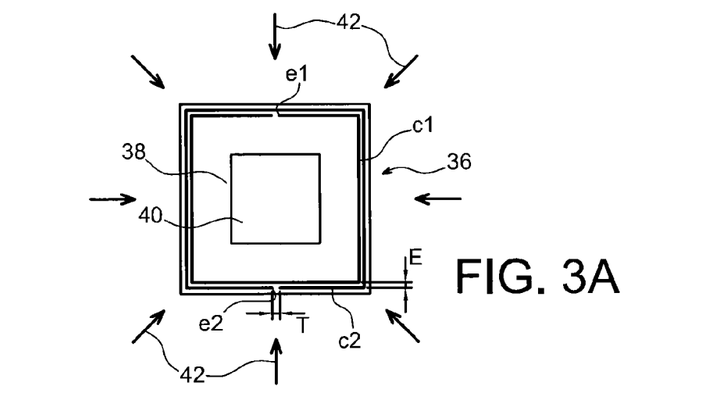
FIGS. 3A and 3B are top diagrammatic views of shields that can be used in the invention against lateral parasite infrared radiation, FIG. 4 diagrammatically shows the progressive reduction of the intensity of this radiation using such shields.
Figure 3B:
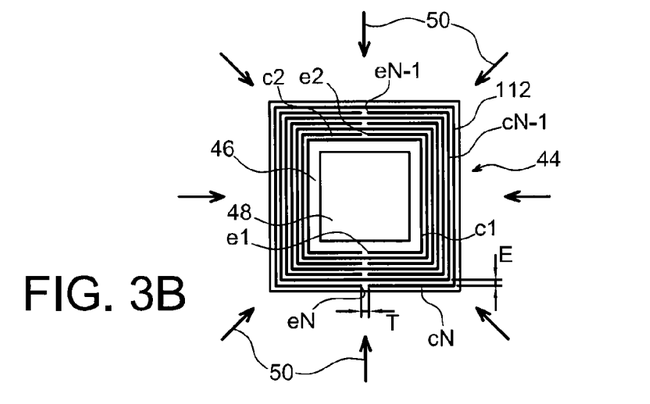

FIGS. 3A and 3B show diagrammatic top views of examples of shields against lateral parasite infrared radiation.

The shield 36 or shield assembly shown in FIG. 3A forms part of an infrared imagery device conforming with the invention, for which we can only see the read circuit 38 and the infrared radiation detector 40 hybridised to the read circuit 38.

The shield assembly 36 will attenuate lateral parasite infrared radiation 42 and is composed of two solder beads c1 and c2 provided with vents e1 and e2 respectively. Bead c1 surrounds the detector 40 and bead c2 surrounds the bead c1.

Vents e1 and e2 are placed such that the two beads with these vents form a baffle. Therefore the two vents are not facing each other; in the example shown, they are at 180° from each other; we will see why later.

The shield 44 or shield assembly shown in FIG. 3B, forms part of an infrared imagery device conforming with the invention, for which only the read circuit 46 and the infrared radiation detector 48 hybridised to the read circuit 46 can be seen.

The shield assembly 44 will attenuate lateral parasite infrared radiation 50 and is composed of N solder beads c1, c2, . . . , cN−1, cN that are provided with vents e1, e2, . . . , eN−1, eN respectively, where N is an integer number equal to at least 3. In the example shown, the number N is equal to 7. Bead c1 surrounds the detector 40; bead c2 surrounds bead c1; etc.; bead cN surrounds bead cN−1.

The N vents e1 to eN are arranged such that the N beads c1 to cN provided with these vents form at least one baffle; for example there may be N−1 vents facing each other (all on a single side of the detector) and one vent that is not facing these N−1 vents and that is for example at 180° from them (and therefore opposite to them relative to the detector).

But preferably as shown in FIG. 3B, there are several baffles and the corresponding vents for two consecutive beads are still at 180° from each other: vent e1 is at 180° from e2, etc., vent eN−1 is at 180° from vent eN.

Preferably, the sizes of the apertures formed by the vents are such that parasite radiation entering into the baffles formed by these vents is as low as possible. Typically, the size T given to these apertures varies from 1 μm to 10 μm.

Preferably, the space E between two consecutive beads will also vary between 1 μm and 10 μm.

It is preferable that the respective positions of the vents are opposite each other so that the path of incoming parasite radiation is as long as possible. This optimises benefits from losses of intensity of this radiation that is guided between the walls of the solder beads: these walls have roughnesses that diffuse parasite radiation; thus, the intensity of this parasite radiation reduces during its successive reflections on the walls.

Figure 4:
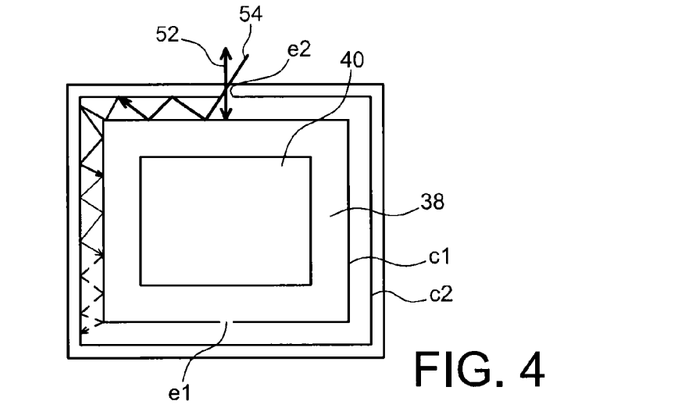

This is diagrammatically shown in FIG. 4 which shows the same example as that in FIG. 3A.

Parasite radiation 52 can be seen that penetrates between the two beads c1 and c2 at normal incidence. This radiation is thus rejected outside the zone delimited by the two beads. A parasite radiation 54 can also be seen guided between the walls of the two beads and that is therefore trapped in the baffle formed by these beads. The intensity of this radiation 54 reduces as it progresses between the walls.

The thickness and height of the solder beads are directly related to the optical architecture used. In the framework of a "camera on chip" approach, optical engineering leads to sizing obtained by ray-tracing.

Figure 5:
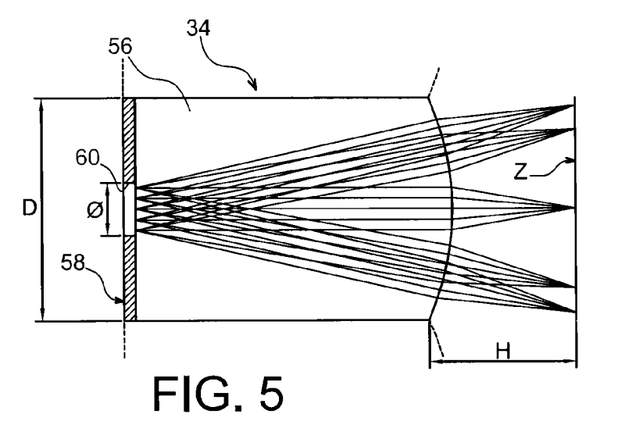
FIG. 5 is a diagrammatic sectional view of an example of an elementary optical channel of a microlens matrix that can be used in the invention.

FIG. 5 is a diagrammatic sectional view of an example of an elementary optical channel 34 in the microlens matrix (FIG. 2). This elementary channel is designed using a commercial ray-tracing software of the Zemax®, or Oslo® or CODE V® type.

This elementary optical channel is characterised by a microlens 56 placed at a distance H from the sensitive zone Z of the infrared radiation detector 40 (FIG. 3A) or 48 (FIG. 3B), zone that is sensitive to infrared radiation.

The distance H is directly related to the focal distance of this microlens. In the example shown, this distance H is between 0 and 1 mm.

A part 58 of the hole mask 32 can also be seen in FIG. 2. This part forms a metal diaphragm with an aperture 60. The dimension D of this diaphragm is larger than the size of a pixel in the sensitive zone Z and is less than the size of the detector; and in the example, the diameter Ø of the aperture 60 is between 0.1 μm and D.

The thickness and the height of solder beads defined by the solder quantity and the wettable surface, very precisely position the optical device above the detector using the flip chip technique.

Figure 6:
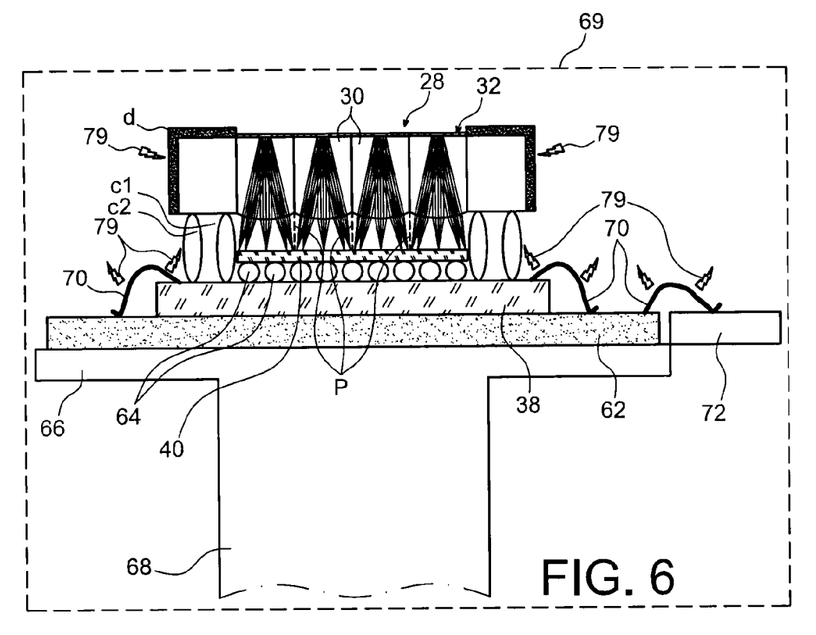
FIG. 6 is a diagrammatic sectional view of a particular embodiment of the infrared imagery device according to the invention.

FIG. 6 shows a diagrammatic sectional view of the example of the infrared imagery device according to the invention, to which we are led. This is a camera on chip that is shielded against frontal and lateral parasite infrared radiation.

In using some of the notations in FIGS. 2 and 3A, FIG. 6 thus shows:
a substrate 62, for example made of ceramic,
the read circuit 38, supported on this substrate,
the infrared radiation detector 40 hybridised to the read circuit by solder balls 64,
a set P of walls that optically isolates each optical channel, the optical device 28 comprising a microlens matrix 30, and
a shield device against frontal and lateral parasite infrared radiation.

This shield device comprises:
the hole mask 32 supported by a first face of the optical device 28, the second face of which opposite the first face faces the infrared radiation detector 40;
deposit d on the sides of the optical device 28 of a material preventing transmission of lateral parasite radiation; in general, it is sufficient that said optical device comprises a material on its sides capable of preventing transmission of lateral parasite radiation; and
a shield assembly formed by the two continuous solder beads c1 and c2 that extend from the read circuit 38 to the optical device 28, in the example shown.

A cold table 66 on which the ceramic substrate 62 is supported and that is prolonged by a cold pin 68 can also be seen; but the machine that lowers the temperature of the cold pin, the cold table and therefore the imagery device to a cryogenic temperature, for example 77K, is not shown.

However, the cryostat in which this imagery device is placed when it is used is shown in dashed lines 69. A window (not shown) is then provided on the wall of the cryostat facing which the optical device 28 is placed.

Portions of wiring 70 can also be seen that electrically connect the read circuit 28 to an output wiring 72. This output wiring will connect the read circuit 38 to electronic control means (not shown) of the imagery device, that are placed outside the cryostat (but they could equally well be placed inside the cryostat).

Figure 7:
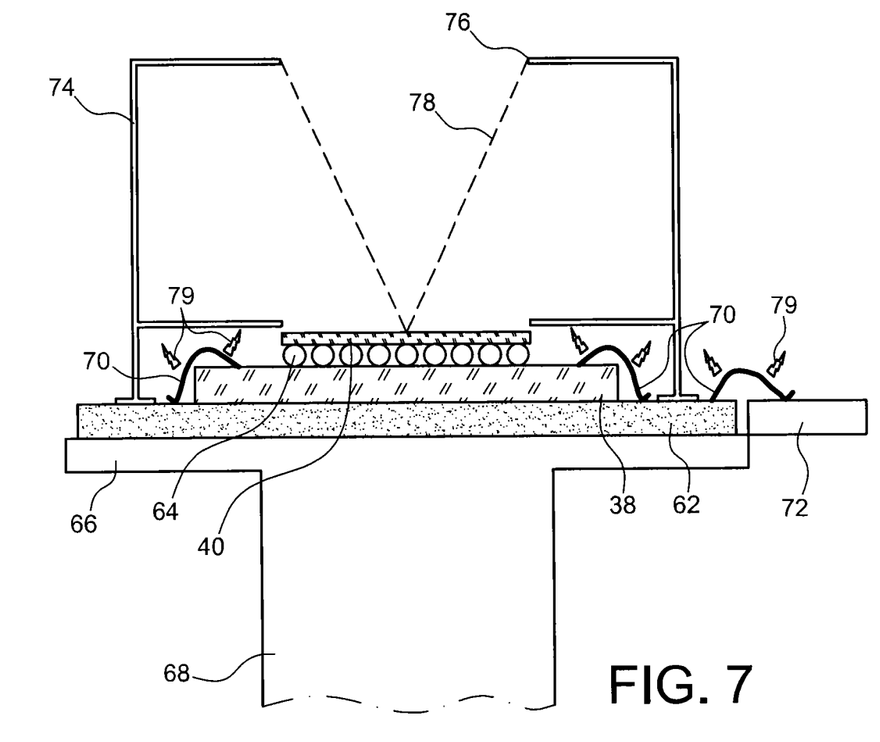
FIG. 7 is a diagrammatic sectional view of an example of a conventional infrared imagery device.

FIG. 7 shows a diagrammatic sectional view of an example of a conventional imagery device. In this FIG. 7, the infrared radiation detector 40 can be seen hybridised to the read circuit 38, the substrate 62 supporting the read circuit, the cold table 66 extended by the cold pin 68, the wiring 70 and the output wiring 72.

In the case shown in FIG. 7, the protection of the detector 40 against parasite infrared radiation is provided by a cold screen 74. This cold screen comprises an aperture 76 facing the detector 40 and that defines a view angle 78.

The cryostat in which the device in FIG. 7 is placed for its use is not shown. This cryostat is provided with a window facing the aperture 76. And the imagery device comprises optics (not shown) placed outside the cryostat, facing the window.

If FIGS. 6 and 7 are compared with each other, it can be seen that in the device in FIG. 6, the cold screen of the device in FIG. 7 is replaced by:
an upper shield formed on the optical device and composed of the hole mask 32, namely a layer in which apertures are formed and made of a material that stops frontal parasite infrared radiation to protect the detector against this radiation,
a deposit d, on the sides of the optical device 28 preventing transmission of lateral parasite radiation, and
a peripheral shield formed by two solder beads c1 and c2 that protect the detector against lateral parasite infrared radiation, particularly against radiation 79 resulting from passage of current in the wiring 70.

Variants of the "camera on chip" configuration could be envisaged, considering the fact that the peripheral solder beads may be made on any support positioned under the detector, provided that the detector is always protected against parasite radiation.

Figure 8:
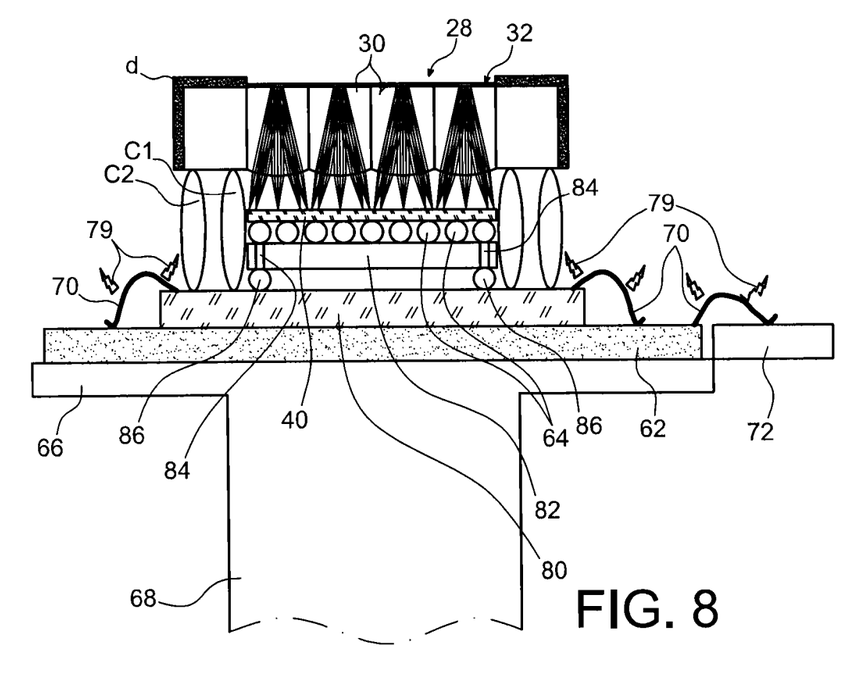
FIGS. 8 and 9 are diagrammatic sectional views of other particular embodiments of the infrared imagery device according to the invention, FIGS. 10A, 10B, 11A, 11B, 12A, 12B, 13A and 13B diagrammatically show the steps in a method of manufacturing an example of the infrared imagery device according to the invention, the letter A corresponding to top views and letter B to sectional views, and FIGS. 14A to 14F and 15A to 15C diagrammatically show steps in the flip chip assembly technique.

For example, considering a System-In-Package type configuration comprising a stack of chips interconnected by through-silicon vias, the result is another structure conforming with the invention. FIG. 8 shows a diagrammatic sectional view of this other structure.

As can be seen, the device shown in FIG. 8 is different from that shown in FIG. 6 in that it also comprises an interconnection network 80. This interconnection network is supported on the substrate 62.

The detector 40 is hybridised to a read circuit 82 similar to the read circuit 38 in FIG. 6, through solder balls 64. This read circuit comprises through-silicon vias 84 hybridised to the interconnection network through other solder balls 86.

Furthermore in the case shown in FIG. 8, solder beads C1 and C2 corresponding to beads c1 and c2 in FIG. 6, extend from the interconnection network 80 to the optical device 28. And the output wiring 72 is now connected to the interconnection network 80 through the wiring 70.

In general, beads supporting the diaphragmed optical device may be placed on any support, including the substrate 62 and the detector 40 itself, provided that these beads are in (indirect) contact with the cold pin 68 and protect the detector 40 from parasite infrared radiation sources in the cryostat (particularly the wiring and the hot walls of the cryostat) when the imagery device is in it and ready to be used.

If it is required to place the beads on a ceramic substrate, then appropriate metal zones are provided on this substrate on which the solder can bond.

In the case in which it is required to position the beads on the detector, it is arranged such that the beads surround the sensitive zone of the detector, in other words all infrared radiation detection pixels.

A device conforming with the invention could also be designed comprising a set of several optical stages stacked vertically by means of intermediate solder beads. This is diagrammatically shown in FIG. 9 which shows a diagrammatic sectional view of another example of the invention.

Figure 9:
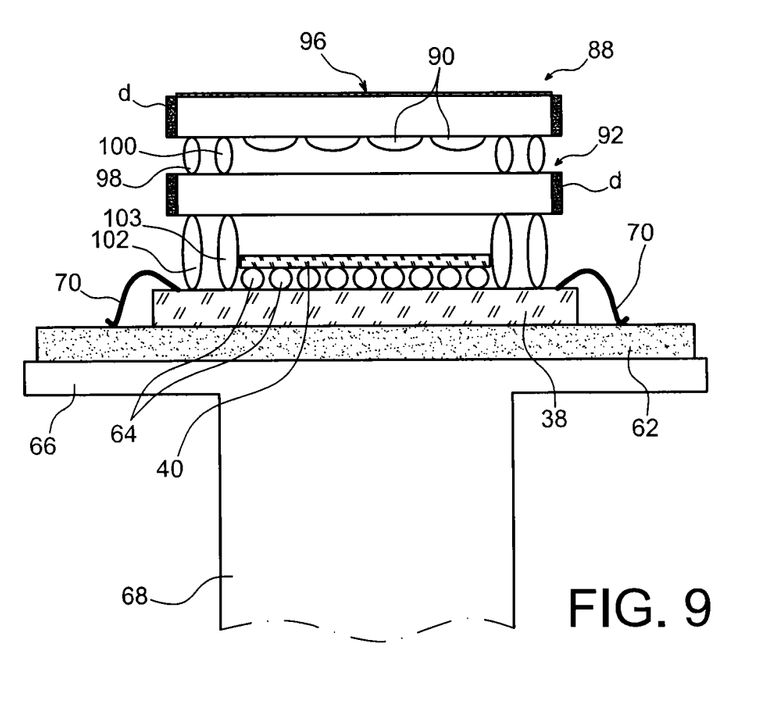

The following are used in the case in FIG. 9:

M optical devices among which the furthest from the infrared radiation detector is provided with a hole mask to stop frontal parasite infrared radiation, and M shield assemblies to attenuate lateral parasite infrared radiation, where M is an integer number greater than 1.

In the example, M is equal to 2, and each shield assembly comprises two solder beads each provided with vents (not shown), as in the case in FIG. 3A.

As can be seen, the imagery device shown in FIG. 9 is different from that shown in FIG. 6 due to the fact that it comprises two optical devices instead of one, each of which can have an imagery function or a spectral filter function. These two functions may also be performed by the same optical device (in order to limit the number of optical devices) in which at least one dioptre was formed to perform an imagery function and has received a treatment limiting the spectral band, or for example an anti-reflection treatment.

The same elements have the same references in FIGS. 6 and 9. The imagery device in FIG. 9 comprises a first optical device 88 comprising a microlens matrix 90 performing an imagery function, and a second optical device 92 performing a cold filter function, between the device 90 and the detector 40.

Furthermore, the lower face of the device 88 is connected to the upper face of the device 92 by two solder beads 98 and 100, and the lower face of the device 92 is connected to the read circuit 38 by two solder beads 102 and 103. And as can be seen, there are still deposits d on the sides of devices 88 and 92 preventing transmission of lateral parasite radiation.

The set of diaphragms of the same type as the hole mask 96 formed in the upper face of the device 88, can be obtained using a metal deposit on the upper face of the optical device in which this hole mask is placed.

Furthermore, according to the invention, the optical architecture is not necessarily a TOMBO type architecture (the meaning of this acronym is described in the article by Jun Tanda et al., mentioned above).

We have described a flip chip technique to make continuous beads with vents. This technique is very efficient in terms of positioning and thermal conductivity.

But all types of transfers onto materials different from those used for implementation of the flip chip technique, for example conducting polymers or nanomaterials, and that enable precise positioning of the optical device due to the properties of the materials used and/or positioning machines, can result in the same shield result.

Furthermore, the optical devices considered in the examples given above are microlens matrices. But this invention can be used with any other type of optical device that has to be placed facing an infrared radiation detector, for example single channel optics, filters, diffraction gratings etc.

Furthermore, in the examples given above, hole masks were used for shielding the detector against frontal parasite infrared radiation. But other shields are possible against this radiation, for example a coded mask, a diaphragm, an iris, etc.

Note that this invention has the following particular advantages:

it does not use a cold screen which is a large volume part;
it enables a reduction in the volume of the cryostat, which is why the invention is helpful for the integration into means, for example such as light aircraft, which can only contain compact objects; and
it enables a reduction in the time necessary to reach the cryogenic operating temperature, for example 77K, due to the reduction in the mass to be cooled.

The following describes steps in a method of manufacturing an example of the imagery device according to the invention with reference to FIGS. 10A to 13B. Each of these steps uses the flip chip assembly technique which will be discussed again later.

Figures to which the letter A is appended correspond to diagrammatic top views and figures to which the letter B is appended correspond to diagrammatic sectional views.

Figure 10A:
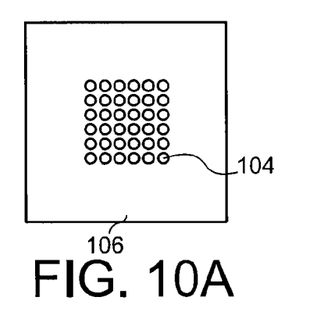
Figure 10B:
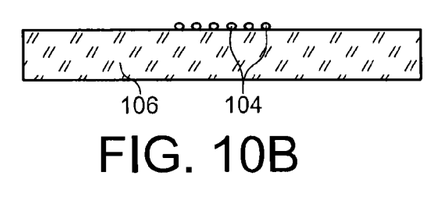

The first step is to form a set of solder balls 104 on a read circuit 106, or on any other host circuit, in order to hybridise an infrared radiation detector with this read circuit (FIGS. 10A and 10B).

Figure 11A:
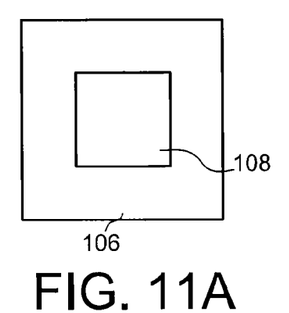
Figure 11B:
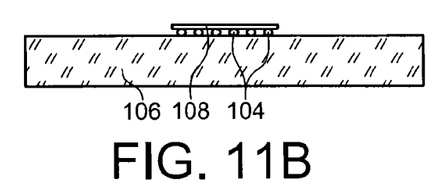

The next step is to make an imagery system, for example of the IRCMOS (InfraRed Complementary Metal Oxide Semiconductor) type by hybridisation of an appropriate infrared detection circuit 108 on the read circuit 106 by means of solder balls 104 (FIGS. 11A and 11B). Note that the metal pads in circuits 106 and 108 to which the solder bonds are not shown.

The next step is to form two continuous peripheral solder beads 110 and 112 with vents 114 and 116 respectively on the read circuit 106 around the detector 108 (FIGS. 12A and 12B), which leads to a structure like that shown in FIG. 3A.

Figure 12A:
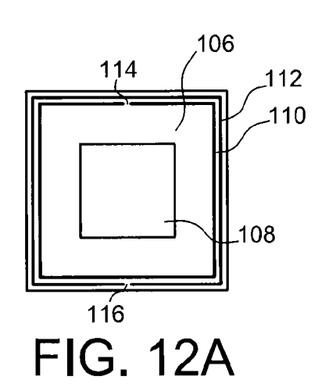
Figure 12B:
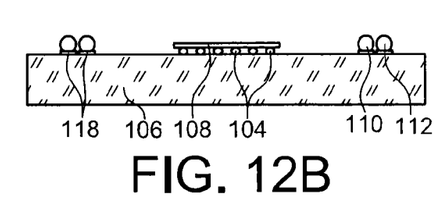

Note that the read circuit 106 has previously been provided with appropriate metal surfaces 118 wettable by the solder so that the solder can be added to form the two beads. Note also that the vents are formed at the same time as the beads: the photolithography mask used for this formation is provided for this purpose.

Figure 13A:
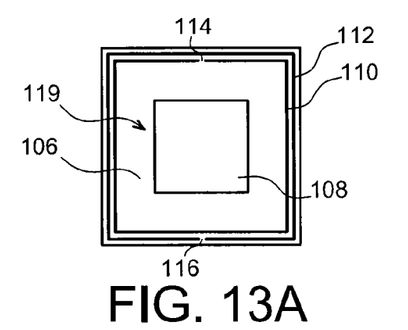
Figure 13B:
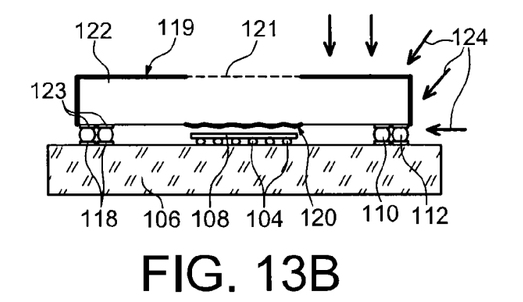

The next step is hybridisation of an optical device 119 on the read circuit 106 (FIGS. 13A and 13B). It can be seen that this optical device 119 is substantially of the same type as the device 28 in FIG. 6. It comprises microlenses 120 and a hole mask 121 (set of diaphragms) and a peripheral shield 122 (metallisation); it is also provided with appropriate metal surfaces 123, wettable by solder, for hybridisation.

Consequently, the structure obtained is protected against parasite infrared radiation 124.

The result is therefore a device of the type shown in FIG. 6. Those skilled in the art can obviously adapt the process that has just been described to form devices of the type shown in FIGS. 8 and 9.

The following briefly describes various steps in the flip chip assembly technique with reference to diagrammatic sectional and partial views in FIGS. 14A to 14F and 15A to 15C.

Figure 14A:
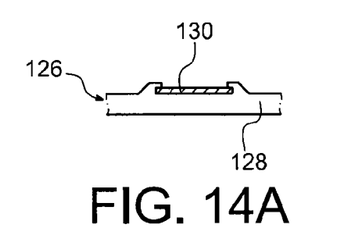
Figure 14B:
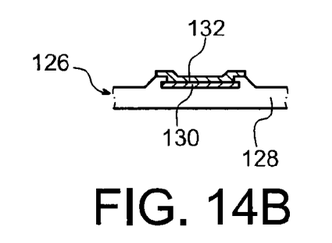

The first step is to provide a component 126, for example a CMOS circuit from the foundry, with passivation zones such as zone 128, and metal disks for example made of aluminium like disk 130, in these zones (FIG. 14A). The next step is to deposit wetting surfaces such as surface 132 on the metal disks (FIG. 14B).

Figure 14C:
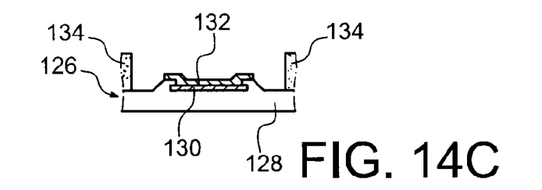
Figure 14D:
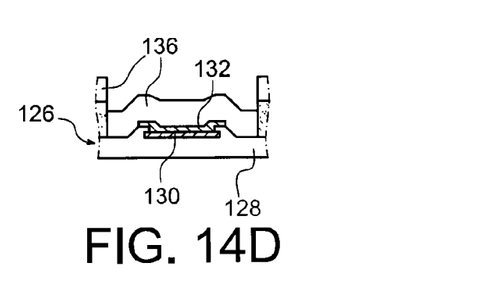

The next step is photolithography in order to define useful volumes of solder, for example indium, that are necessary on the wetting surfaces, using photosensitive resin elements such as element 134 (FIG. 14C). The solder is then deposited and useful solder volumes such as volume 136 are thus formed (FIG. 14D).

Figure 14E:
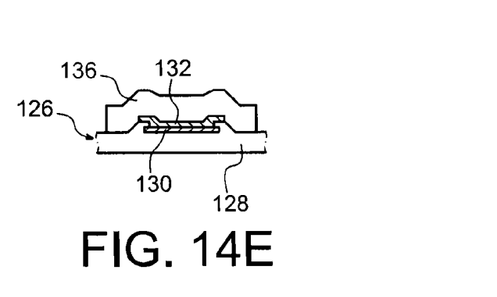
Figure 14F:
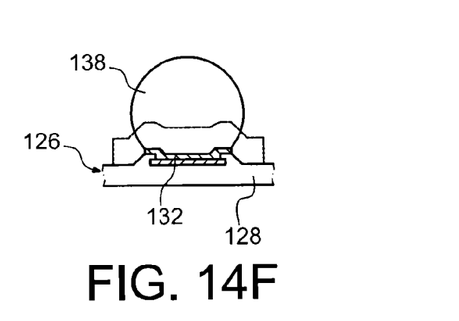

The next step is lift off to eliminate the photosensitive resin (FIG. 14E). Reflow is then done to form solder balls like ball 138, on their corresponding wetting surfaces (FIG. 14F).

Therefore, we have just described a technique for the formation of solder balls that uses lift off. But other techniques for the formation of balls can be used; for example, it is possible to transfer discrete balls, or to use ink jet, electrolysis or photolithography.

All these techniques have in common the fact that the morphology of each ball (diameter, height) depends on the volume of the deposited material—the quantity of indium in the example—and the wettable surface area (future base of the ball after reflow).

The next step is hybridisation of another component 140 provided with pads 142, onto the component 126.

The first step is to align the two components 126 and 140, for example using a flip chip bonder, using an appropriate microscope 144. For example, the device marketed by the SET Company reference FC 150 (FIG. 15A) could be used.

Figure 15A:
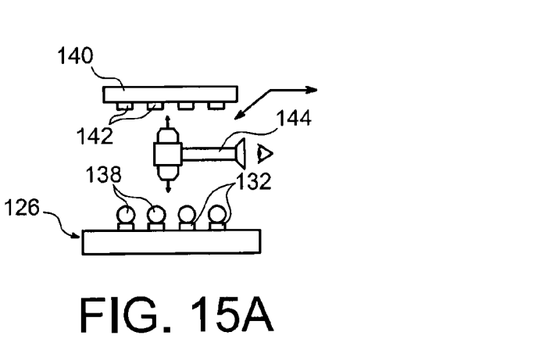
Figure 15B:
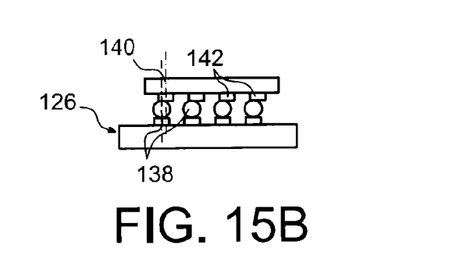
Figure 15C:
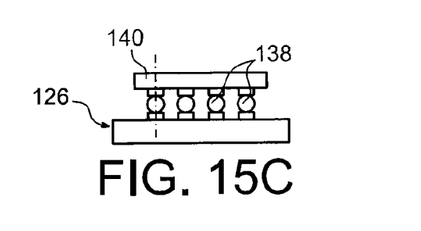

Then, the pads 142 of the component 140 are positioned on the corresponding solder balls 138 of the component 126 (FIG. 15B). The next step is reflow of the balls 138, causing self-alignment of the components 126 and 140 (FIG. 15C).

Consider the optical device used in the invention once again.

This optical device is not necessarily rigid: in the invention, a flexible optical device can be used that is to be made curved using different size beads to help curve it, while maintaining the shield against parasite infrared radiation that results from beads.

Furthermore, solder beads are used in the examples given above, but other types of beads are possible:

For example, tubular beads that still have said vents, and are still made of a material for example metal that attenuates infrared radiation, and that nest into each other, can be used.

For example, considering the case in FIG. 6 once again, bead c2 can be replaced by a first portion of tube supported on circuit 38 and bead c1 can be replaced by a second portion of tube supported on component 28 and nesting into the first portion.

Furthermore, in the special case of an optical device with multiple channels, some of the infrared radiation flux that is outside the field of the imagery device is not screened by the diaphragm on the optical device (hole mask 32 in the example in FIG. 6), and can therefore focus on a zone of the detector dedicated to channels adjacent to a given channel.

In this case, the flanks of the different channels can be processed to form metal deposits on them in order to stop this inter-channel parasite radiation.

This is diagrammatically shown in FIG. 6 which shows the set of walls P. These walls are arranged between the microlens matrix 28 and the detector 40, and will separate the channels from each other.

In fact, this is a transposition of the peripheral shield that is dealt with in the description of FIG. 13B, at a channel.

Further information about these walls is given in the article by Jun Tanida et al. mentioned above.

The invention claimed is:

1. An infrared imagery device comprising:
    a support, comprising an infrared radiation detector that comprises a zone sensitive to infrared radiation,
    at least one optical device, placed facing the infrared radiation detector, and
    a shield device against frontal parasite infrared radiation capable of penetrating into a space between the support and the optical device, through said optical device, and lateral parasite infrared radiation that can penetrate laterally into said space,
    wherein the shield device comprises at least a shield assembly comprising N continuous beads, spaced from each other, each provided with a vent and made of a material that can significantly attenuate lateral parasite radiation, and each of the N beads extends from the support as far as the optical device, in which N is an integer number equal to at least 2, in which a rank 1 bead surrounds at least the sensitive zone of the infrared radiation detector, a rank i bead surrounds a rank i−1 bead, where i varies from 2 to N, and the N beads provided with corresponding vents form at least one baffle.

2. The infrared imagery device according to claim 1, in which, in each shield assembly, the vents for rank i and i+1 beads respectively, where i varies from 1 to N−1, are at 180° from each other.

3. The infrared imagery device according to claim 1, in which the size of each vent is within an interval from 1 µm to 10 µm.

4. The infrared imagery device according to claim 1, in which N is equal to at least 3.

5. The infrared imagery device according to claim 1, in which the spacing between consecutive beads in each shield assembly is within an interval from 1 µm to 10 µm.

6. The infrared imagery device according to claim 1, in which the beads are solder beads.

7. The infrared imagery device according to claim 1, in which the optical device comprises first and second opposite faces, the second face is facing the infrared radiation detector, and the shield device also comprises a layer formed on the first face, made of a material capable of attenuating frontal parasite radiation, and comprises apertures.

8. The infrared imagery device according to claim 1, in which said optical device comprises a material on its sides capable of preventing transmission of lateral parasite radiation.

9. The infrared imagery device according to claim 1, comprising M optical devices, in which the shield device comprises M shield assemblies, where M is an integer number equal to at least 2, each optical device comprises first and second opposite faces, the second face of a rank 1 optical device faces the infrared radiation detector, the second face of a rank j optical device is facing the first face of a rank j−1 optical device, a rank 1 shield assembly extends from the support as far as the rank 1 optical device, and a rank j shield assembly extends from the rank j−1 optical device to the rank j optical device, where j varies from 2 to M, the shield device also comprises a layer formed on the front face of a rank M optical device, and this layer is made of a material capable of attenuating frontal parasite radiation and comprises apertures.

10. The infrared imagery device according to claim 1, in which the support also comprises a substrate and a read circuit on the substrate, the infrared radiation detector is hybridised to the read circuit by solder balls, and the optical device closest to the substrate is connected to one of the elements chosen from among the infrared radiation detector, the read circuit and the substrate through a shield assembly.

11. The infrared imagery device according to claim 10, in which the support also comprises an interconnection network between the substrate and the read circuit, and the optical device closest to the substrate is connected to one of the elements chosen among the infrared radiation detector, the read circuit, the substrate and the interconnection network through a shield assembly.

12. The infrared imagery device according to claim 1, in which at least one optical device comprises a microlens matrix defining elementary detection channels, and the imagery device also comprises a set of walls made of a material capable of significantly attenuating parasite radiation, placed between the microlens matrix and the detector and that will separate the elementary channels from each other.

13. A method of manufacturing the infrared imagery device according to claim 1, said method comprising:
   making the shield assembly on the support comprising the infrared radiation detector,
   placing the optical device facing the infrared radiation detector, and
   fixing the optical device to the shield assembly.

14. The method according to claim 13, comprising:
   assembling the infrared radiation detector to the support using a flip chip technique,
   forming the shield assembly with solder beads, and
   fixing the optical device to the solder beads using the flip chip technique.

\* \* \* \* \*